United States Patent
Lokas

(10) Patent No.: US 8,427,234 B1
(45) Date of Patent: Apr. 23, 2013

(54) METHOD AND APPARATUS FOR PREDISTORTING A SIGNAL

(75) Inventor: Jadran Lokas, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 13/396,250

(22) Filed: Feb. 14, 2012

(51) Int. Cl.
H03F 1/26 (2006.01)

(52) U.S. Cl.
USPC ......... 330/149; 375/296; 375/297; 455/114.3

(58) Field of Classification Search .................. 330/149; 375/296, 297; 455/114.3
See application file for complete search history.

(56) References Cited

U.S. PATENT DOCUMENTS

| | | | |
|---|---|---|---|
| 6,980,604 B2 * | 12/2005 | Kubo et al. ................... | 375/296 |
| 7,251,293 B2 | 7/2007 | Vella-Coleiro | |
| 7,340,223 B1 | 3/2008 | Wright et al. | |
| 7,430,248 B2 | 9/2008 | McCallister | |
| 7,689,180 B2 * | 3/2010 | Grundlingh et al. .......... | 455/126 |
| 7,702,301 B2 * | 4/2010 | Rabjohn et al. ............... | 455/126 |
| 2008/0137772 A1 | 6/2008 | Behzad et al. | |
| 2009/0027119 A1 * | 1/2009 | Williams et al. .............. | 330/149 |

* cited by examiner

Primary Examiner — Patricia Nguyen
(74) Attorney, Agent, or Firm — Coats & Bennett, P.L.L.C.

(57) ABSTRACT

A circuit herein compensates an input signal for distortion introduced to that signal by a non-linear device. A predistorter predistorts the input signal based on a predistortion model to compensate for distortion introduced by the non-linear device. When this predistorted input signal is input into the non-linear device, the device produces an output signal as a function of the predistorted input signal. From this output signal, a feedback generation circuit generates a feedback signal that includes one or more input signal components and one or more distortion components. A selective attenuation circuit selectively attenuates the input signal components in this feedback signal to generate a modified version of the feedback signal with a reduced magnitude difference between the input signal components and the distortion components. Finally, a model adaptation circuit dynamically adapts model parameters of the predistortion model based on the modified version of the feedback signal.

22 Claims, 6 Drawing Sheets

METHOD AND APPARATUS FOR PREDISTORTING A SIGNAL

TECHNICAL FIELD

The present invention generally relates to compensating an input signal for distortion introduced to that signal by a non-linear device, and particularly relates to selectively attenuating input signal components in a feedback signal, in order to enhance observation of distortion components in that feedback signal.

BACKGROUND

The design of radio-frequency power amplifiers for communications applications often involves a trade-off between linearity and efficiency. Power amplifiers are typically most efficient when operated at or near the saturation point. However, the response of the amplifier at or near the point of saturation is non-linear, resulting in both phase and amplitude distortion (e.g., intermodulation products). The non-linear response of a power amplifier causes out-of-band emissions and reduces the spectral efficiency in a communication system. In most communication systems, constraints are imposed on the linearity of the transmitted signal both inside and outside the operational band.

One way to improve a power amplifier's efficiency and its overall linearity is to predistort the input signal to the power amplifier, in order to compensate for the distortion introduced to the input signal by the power amplifier. In effect, the input signal to the power amplifier is intentionally distorted so that the added distortion, i.e. predistortion, cancels or at least mitigates the distortion introduced by the power amplifier. Generally, the predistortion is applied to the input signal digitally at baseband frequencies, i.e., before the input signal is up-converted to radio frequencies.

The appropriate predistortion is determined by a predistortion model that is dynamically adapted based on a feedback signal from the output of the power amplifier. To the extent that the output of the power amplifier is distorted, the predistortion model can be adjusted based on the feedback signal to reduce that distortion. Problematically, however, the degree to which such distortion can be reduced is limited by the degree to which that distortion can be observed in the feedback signal.

SUMMARY

Embodiments herein dynamically adapt a model used to predistort a signal input into a non-linear device, based on observing distortion components in a feedback signal generated from the output of that non-linear device. Notably, the embodiments advantageously enhance observation of the distortion components in the feedback signal as compared to known predistortion approaches, by selectively attenuating the input signal components in the feedback signal. With observation of the distortion components enhanced, the predistortion model is adapted in a way that more effectively mitigates those distortion components.

More particularly, embodiments herein include a circuit configured to compensate an input signal for distortion introduced to that signal by a non-linear device. A predistorter predistorts the input signal based on a predistortion model to compensate for distortion introduced by the non-linear device. When this predistorted input signal is input into the non-linear device, the device produces an output signal as a function of the predistorted input signal. From this output signal, a feedback generation circuit generates a feedback signal that includes one or more input signal components and one or more distortion components. A selective attenuation circuit selectively attenuates the input signal components in this feedback signal to generate a modified version of the feedback signal with a reduced magnitude difference between the input signal components and the distortion components. Finally, a model adaptation circuit dynamically adapts model parameters of the predistortion model based on the modified version of the feedback signal.

In at least some embodiments, the selective attenuation circuit is configured to selectively attenuate the input signal components in the feedback signal by removing a version of the input signal from the feedback signal. In this case, at least one of the phase and magnitude of the version of the input signal may be manipulated, as needed, for the input signal components to be selectively attenuated by a predefined amount. While this manipulation is being performed, the model adaptation circuit may pause its dynamic adaptation of the model parameters. The model parameters do not become stale during the interim because the manipulation occurs over only a relatively short interval of time, meaning that pausing parameter adaptation does not degrade predistortion performance.

Note that the modified version of the input signal may be further conditions to establish unity gain. Unity gain as used herein is established when the magnitude of the input signal components in the modified version of the feedback signal matches the magnitude of the input signal itself. Establishing such unity gain mitigates the possibility of the predistorter itself introducing additional non-linearities to the input signal.

In such embodiments, the circuit further includes a non-selective attenuation circuit. The non-selective attenuation circuit non-selectively attenuates the modified version of the feedback signal as a whole (i.e., both input signal components and distortion components), rather than just selectively attenuating the input signal components. More specifically, the non-selective attenuation circuit attenuates the modified version of the feedback signal as a whole, as needed to establish unity gain.

The particular amount of attenuation that the non-selective attenuation circuit applies to establish unity gain depends on the amount of attenuation applied by the selective attenuation circuit. Accordingly, responsive to changes in the amount by which the selective attenuation circuit selectively attenuates the input signal components in the feedback signal, the non-selective attenuation circuit may dynamically adjust the amount by which it non-selectively attenuates the modified version of the feedback signal, as needed to re-establish unity gain. Because selective attenuation will decrease the amount of non-selective attenuation needed to establish unity gain, the distortion components in the signal provided to the model adaptation circuit will have a greater magnitude than when selective attenuation is not applied. Because of this, the model adaptation circuit will be better able to observe and mitigate those distortion components.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
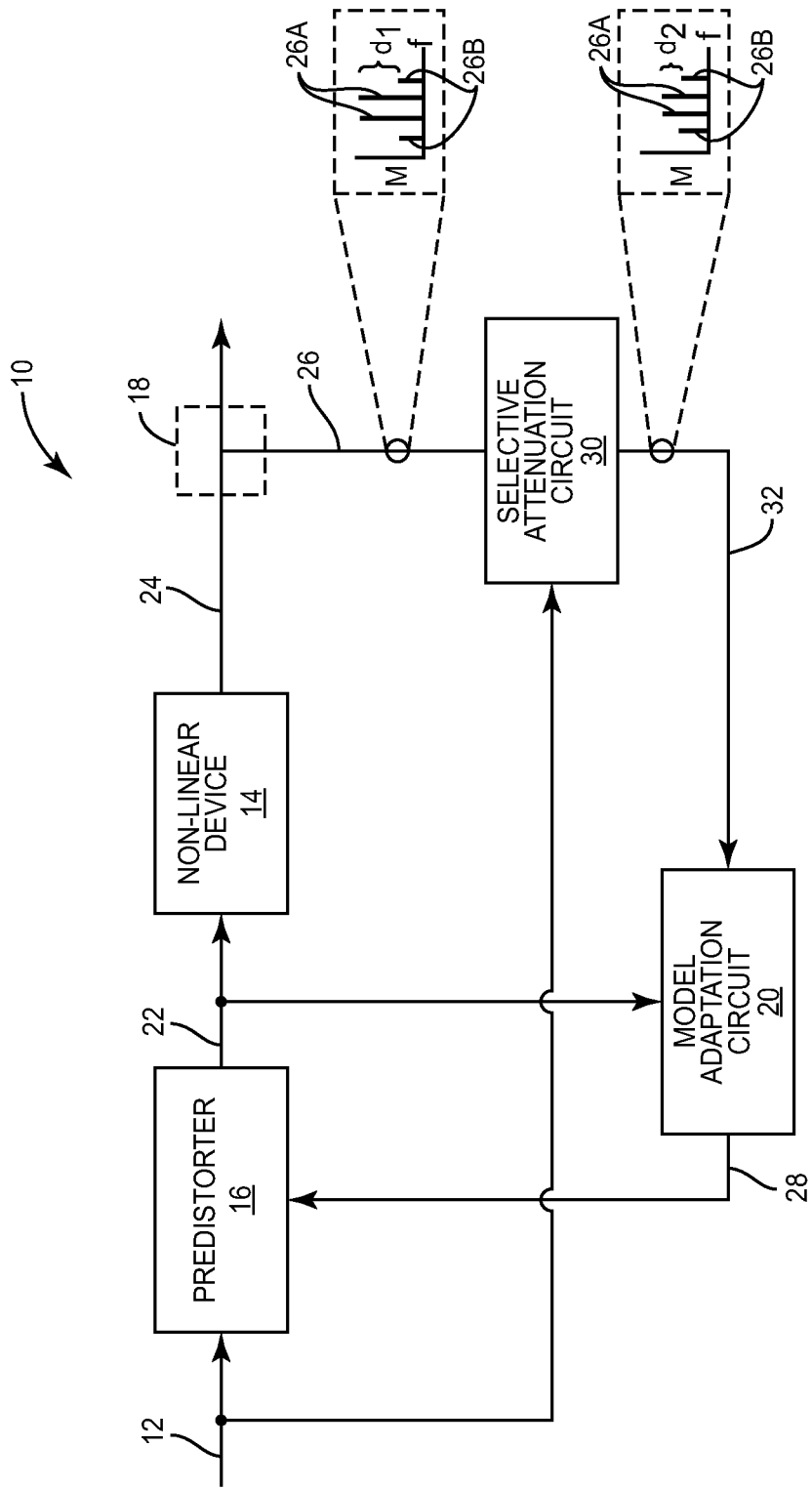
FIG. 1 is a block diagram of a circuit configured to compensate an input signal for distortion introduced to that signal by a non-linear device, according to one or more embodiments.

FIG. 1 depicts a circuit 10 that is configured to compensate an input signal 12 for distortion introduced to that signal 12 by a non-linear device 14. In some embodiments, for example, the circuit 10 comprises part of the transmit chain of a wireless device, with the non-linear device 14 being a radio-frequency (RF) power amplifier and the input signal 12 being a communication signal to be transmitted over an air interface. Regardless, the circuit 10 includes a predistorter 16, the non-linear device 14, a feedback generation circuit 18, and a model adaptation circuit 20.

The predistorter 16 is configured to predistort the input signal 12, based on a predistortion model, to compensate for distortion introduced by the non-linear device 14. This predistorted input signal 22 is then input into the non-linear device 14. The non-linear device produces an output signal 24 as a function of this predistorted input signal 22, such as by amplifying the predistorted input signal 22 in the case that the non-linear device 14 is a power amplifier.

If the parameters of the predistortion model are properly configured to have a transfer function that effectively reverses the non-linear effects of the non-linear device 14, then distortion components in the output signal 24 will be smaller than if the non-linear device 14 were used alone, i.e., without the predistorter 16. To properly configure these model parameters, the feedback generation circuit 18 generates a feedback signal 26 from the output signal 24 and the model adaptation circuit 20 dynamically adapts the model parameters as a function of that feedback signal 26 (as well as the predistorted input signal 22). The model adaptation circuit 20, for instance, observes and analyzes distortion components in the feedback signal 26 and sends a control signal 28 to the predistorter 16 indicating adjustments to the predistortion model's parameters that will mitigate those distortion components.

Notably, the circuit 10 enhances the ability of the model adaptation circuit 20 to observe the distortion components in the feedback signal 26 as compared to known predistortion approaches, by selectively attenuating input signal components in the feedback signal 26. With observation of the distortion components advantageously enhanced, the model adaptation circuit 20 adapts the model parameters in a way that more effectively mitigates those distortion components.

In more detail, FIG. 1 shows that the feedback signal 26 includes one or more components 26A that correspond to the input signal 12 (here, an exemplary two-toned signal) and that are therefore referred to as input signal components 26A. The feedback signal 26 also includes one or more components 26B that correspond to distortion introduced by the non-linear device 14 and that are therefore referred to as distortion components 26B. (M in FIG. 1 represents the magnitude of the components 26A, 26B, while f represents the frequency of those components). Composed of these components, the feedback signal 26 is input into a selective attenuation circuit 30 before being fed to the model adaptation circuit 20.

The selective attenuation circuit 30 selectively attenuates the input signal components 26A in the feedback signal 26 to thereby generate a modified version 32 of the feedback signal 26. That is, the selective attenuate circuit 30 attenuates the input signal components 26A in the feedback signal 26, while refraining from attenuating the distortion components 26B. Because of the selective nature of such attenuation, the circuit 30 generates the modified version 32 of the feedback signal 26 to have a reduced magnitude difference $d_2$ between the input signal components 26A and the distortion components 26B, as compared to the magnitude difference $d_1$ between those components 26A, 26B in the original feedback signal 26, i.e., $d_2 < d_1$.

The model adaptation circuit 20 receives as input this modified version 32 of the feedback signal 26, rather than the original feedback signal 26. With the reduced magnitude difference between the input signal components 26A and the distortion components 26B, the model adaptation circuit 20 is better able to observe those distortion components 26B. Indeed, as explained more thoroughly below, the distortion components 26B in the modified version 32 of the feedback signal 26 would appear to the model adaptation circuit 20 as having a greater magnitude than the distortion components 26B in the original feedback signal 26, while the input signal components 26B would appear as having the same magnitude. With observation of the distortion components 26B enhanced, the model adaptation circuit 20 bases its dynamic adaptation of the model parameters on the modified version 32 of the feedback signal 26, in order to more effectively mitigate those distortion components 26B.

Figure 2:
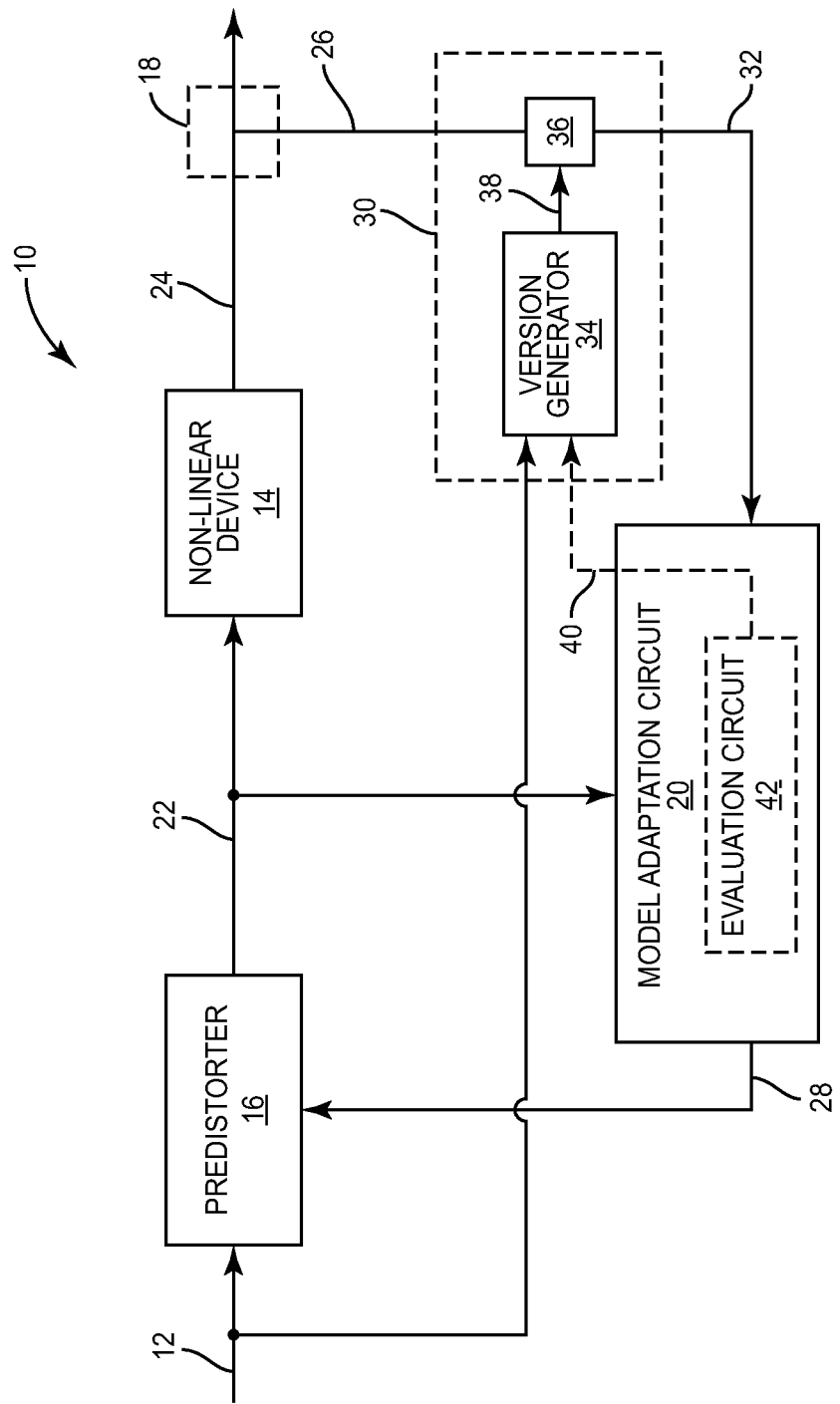
FIG. 2 is a block diagram that illustrates additional details of a selective attenuation circuit included in the circuit of FIG. 1, according to at least some embodiments.
Figure 3:
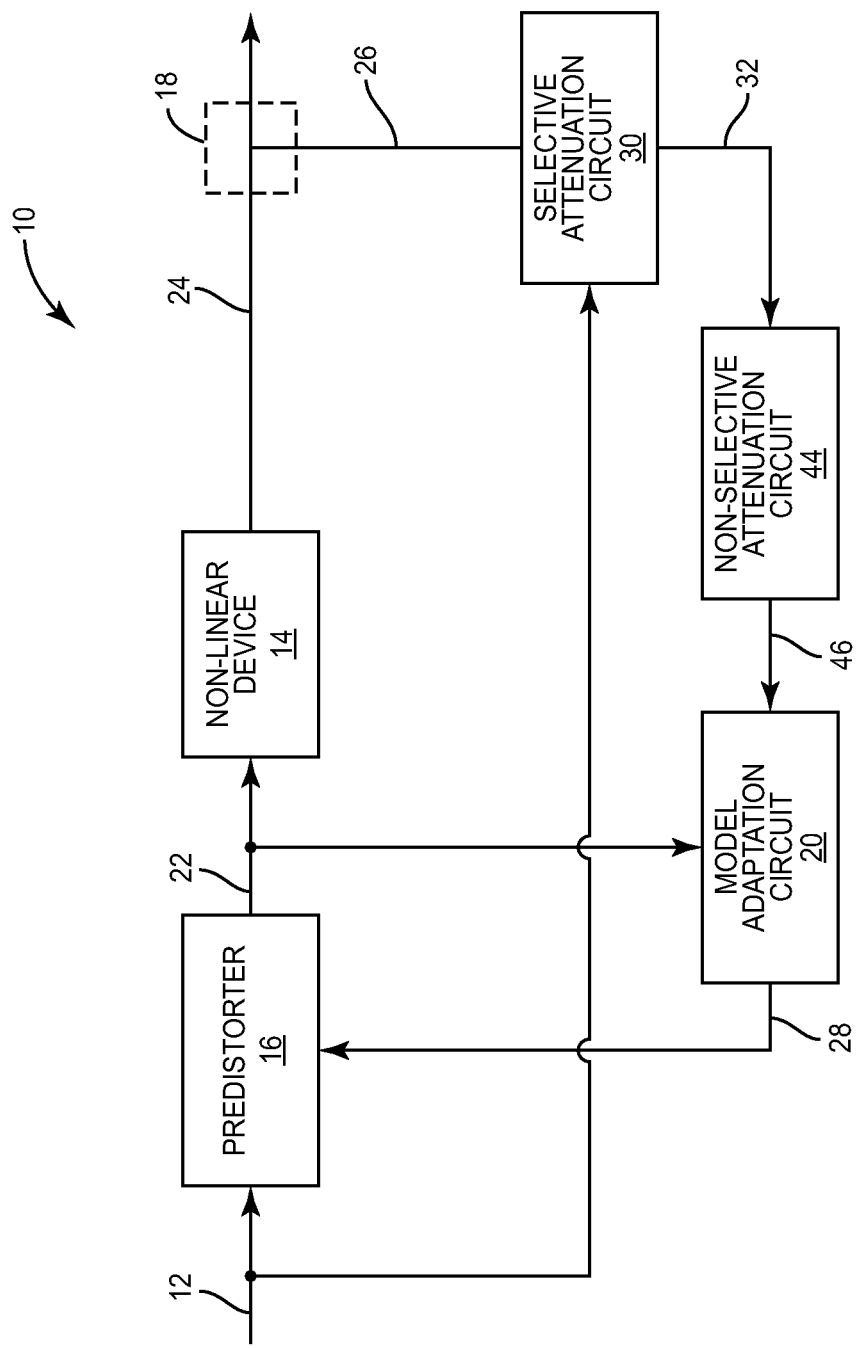
FIG. 3 is a block diagram that introduces a non-selective attenuation circuit to the circuit of FIG. 1, according to one or more embodiments.

In at least some embodiments, the selective attenuation circuit 30 selectively attenuates the input signal components 26A in the feedback signal 26 by removing a version of the input signal 12 from the feedback signal 26. As shown in FIG. 2, for example, the selective attenuation circuit 30 in such embodiments may comprise a version generator 34 and an attenuation circuit 36. The version generator 34 receives the input signal 12 and generates a version 38 of that input signal 12 having, for instance, a different magnitude and/or phase than the input signal 12. The attenuation circuit 36 then removes that version 38 of the input signal 12 from the feedback signal 26 in order to generate the modified version 32 of the feedback signal 26. For example, the attenuation circuit 36 may actually inject the version 38 of the input signal 12 into the feedback path associated with the feedback signal 26, e.g., via a coupler.

Regardless, in order to generate the modified version 32 of the feedback signal 26 with selectively attenuated input signal components 26A, the version generator 34 may be configured to generate the version 38 of the input signal 12 to have a particular phase and magnitude. Indeed, the version generator 34 in at least one embodiment generates the version 38 of the input signal 12 to have a phase and magnitude such that its removal from the feedback signal 26 selectively attenuates the input signal components 26A by a predefined amount (e.g., by an amount on the order of 10 to 30 dB). This predefined amount may be stored in memory (not shown) and may be statically fixed or dynamically adjusted based on one or more parameters associated with characteristics of the input signal 12, the non-linear device 14, or the like. Moreover, the version generator 34 may generate the version 38 of the input signal 12 to have either the same phase or a different phase than the input signal 12, depending on whether the attenuation circuit 36 effectively subtracts or adds the version 38 to the feedback signal 26.

In at least some embodiments, the version generator 34 advantageously generates the version 38 of the input signal 12 in accordance with a control signal 40 received from an evaluation circuit 42. As shown in FIG. 2, such an evaluation circuit 42 is incorporated within the model adaptation circuit 20 in order to efficiently utilize processing of the model adaptation circuit 20. But, regardless of where the evaluation circuit 42 is implemented, the circuit 42 is configured to iteratively evaluate the amount by which the input signal components 26A within the modified version 32 of the feedback signal 26 are selectively attenuated. The evaluation circuit 42 then generates the control signal 40, based on that evaluation, to control the version generator 24. More specifically, the evaluation circuit 42 generates the control signal 40 to manipulate at least one of the phase and magnitude of the version 38 of the input signal 12, as needed, for the evaluation to indicate that the input signal components 26A are selectively attenuated by the predefined amount. Of course, in other embodiments not shown, the evaluation circuit 42 may send the results of the evaluation to a separate controller (not shown) that actually generates the control signal 40 for controlling the version generator 34.

Note that the input signal components 26A of the modified version 32 of the feedback signal 26 may not be attenuated by the predefined amount until the end of this iterative phase and/or magnitude manipulation. For at least this reason, it may not be appropriate for the model adaptation circuit 20 to adapt the model parameters based on the modified version 32 of the feedback signal 26 during the interim.

Accordingly, in at least some embodiments, the model adaptation circuit 20 is configured to pause its adaptation of the model parameters for a predefined interval of time during which this iterative evaluation and phase/magnitude manipulation are performed. This predefined interval of time needed for evaluation and manipulation (e.g., a few seconds) notably proves shorter than the periodicity with which the characteristics of the non-linear device 14 may change. Thus, the model parameters on which the predistorter 16 bases its predistortion do not become stale during this relatively short interval of time, meaning that pausing parameter adaptation for the interval of time does not degrade predistortion performance.

Similarly, the iterative evaluation and phase/magnitude manipulation may be performed occasionally or periodically in order to ensure that the feedback signal 26 is selectively attenuated by an amount appropriate for the current state of the circuit 10. For example, the evaluation and manipulation may be performed periodically every 10 to 30 seconds, or may be performed responsive to an indication that characteristics of the input signal 12 have changed.

Note also that the circuit 10 may further condition the modified version 32 of the feedback signal 26 in order to establish so-called unity gain. Unity gain as used herein is established when the magnitude of the input signal components 26A in the modified version 32 of the feedback signal 26 matches the magnitude of the input signal 12 itself. Establishing such unity gain mitigates the possibility of the predistorter 16 itself introducing additional non-linearities to the input signal 12.

To this end, the circuit 10 in one or more embodiments further includes a non-selective attenuation circuit 44. Contrasted with the selective attenuation circuit 30, the non-selective attenuation circuit 44 is configured to non-selectively attenuate the modified version 32 of the feedback signal 26 as a whole (i.e., both input signal components 26A and distortion components 26B), rather than just selectively attenuating the input signal components 26A. More specifically, the non-selective attenuation circuit 44 attenuates the modified version 32 of the feedback signal 26 as a whole, as needed to establish unity gain. This way, the input signal components 26A in the modified version 32 of the feedback signal 26, as output by the non-selective attenuation circuit 44 (shown here as signal 46), will have a magnitude that matches that of the input signal 12.

The particular amount of attenuation that the non-selective attenuation circuit 44 applies to establish unity gain depends on the amount of attenuation applied by the selective attenuation circuit 30. Accordingly, responsive to changes in the amount by which the selective attenuation circuit 30 selectively attenuates the input signal components 26A in the feedback signal 26, the non-selective attenuation circuit 44 may dynamically adjust the amount by which it non-selectively attenuates the modified version 32 of the feedback signal 26, as needed to re-establish unity gain. Consider the example depicted in FIGS. 4A-4B.

Figure 4A:
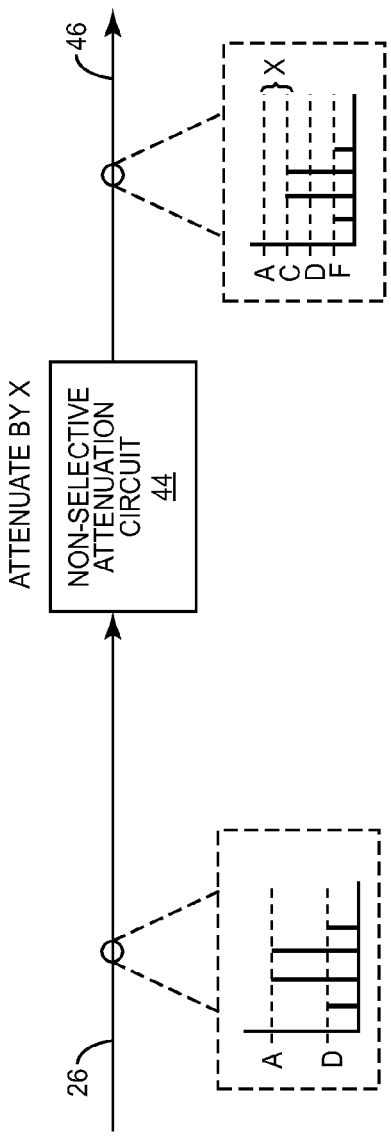
FIGS. 4A-4B are detailed block diagrams that illustrate non-selective and selective attenuation of feedback signal components by the circuit of FIG. 3, according to one or more embodiments.

FIG. 4A illustrates an exemplary initial state of the circuit 10, where the selective attenuation circuit 30 does not attenuate the feedback signal 26 at all (for ease of illustration, therefore, the selective attenuation circuit 30 is not shown). The input signal components in the feedback signal 26 have a magnitude of A, while the distortion components 26B have a magnitude of D. If the input signal 12 has a magnitude of C, the non-selective attenuation circuit 44 non-selectively attenuates the feedback signal 26 by an amount A-C, which is denoted here for simplicity as X=A-C. Indeed, by non-selectively attenuating the feedback signal 26 by this amount X, the non-selective attenuation circuit 44 establishes unity gain whereby the input signal components 26A in the signal 46 provided to the model adaptation circuit 20 have the same magnitude C as that of the input signal 12. Note that since the applied attenuation is non-selective, the distortion components 26B are also attenuated, from a magnitude of D down to a magnitude of F.

Figure 4B:
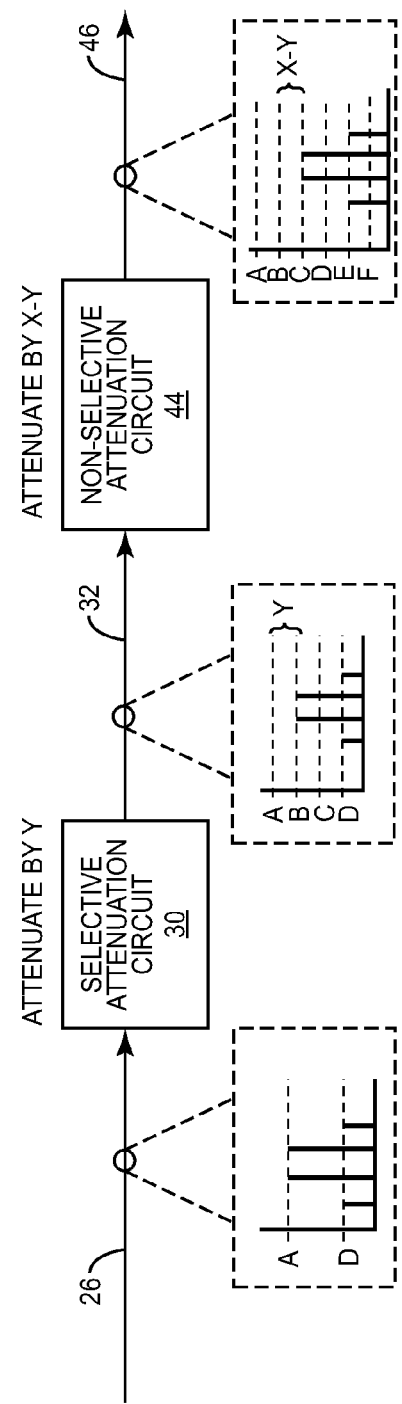

FIG. 4B by contrast illustrates the state of the circuit 10 when the selective attenuation circuit 30 has already been configured to selectively attenuate the input signal components 26A in the feedback signal 26 by a predefined amount. As noted above, such configuration may have entailed the model adaptation circuit 20 pausing its dynamic adaptation of the model parameters until a version generator 34 could generate a version 38 of the input signal 12 that, when removed from the feedback signal 26, selectively attenuated the input signal components 26A by the predefined amount. As shown in FIG. 4B, this predefined amount is denoted as Y=A-B, meaning that the selective attenuation circuit 30 attenuates the input signal components 26A in the feedback signal 26 from a magnitude of A down to a magnitude of B (where the magnitude B is greater than the magnitude C needed for unity gain). Note that since the applied attenuation is selective and thus limited to attenuation of the input signal components 26A, the distortion components 26B have the same magnitude D before and after the selective attenuation circuit 30.

Responsive to the selective attenuation circuit 30 being configured to attenuate the input signal components 26A in the feedback signal 26, the non-selective attenuation circuit 44 is re-configured to attenuate the modified version 32 of the feedback signal 26 by a lesser amount, since, now, less attenuation is needed for unity gain. In FIGS. 4A-4B, for example, when the selective attenuation circuit 30 is configured to apply an attenuation of Y, the non-selective attenuation circuit 44 is re-configured from applying an attenuation of X to only applying an attenuation of X-Y.

By applying an attenuation of X-Y, the non-selective attenuation circuit 44 re-establishes unity gain whereby the input signal components 26A in the signal 46 provided to the model adaptation circuit 20 have the same magnitude C as that of the input signal 12. Notably, however, since the non-selective attenuation circuit 44 only needed to apply an attenuation of X-Y to establish unity gain in FIG. 4B, the distortion components 26B in the signal 46 provided to the model adaptation circuit 20 have a greater magnitude E than when the non-selective attenuation circuit 44 needed to apply an attenuation of X in FIG. 4A (i.e., than without the selective attenuation circuit 30). Because of this, the model adaptation circuit 20 will be better able to observe those distortion components 26B once it unpauses its dynamic adaptation of the model parameters. With observation of the distortion components 26B enhanced, the model adaptation circuit 20 more effectively mitigates those distortion components 26B.

Figure 5:
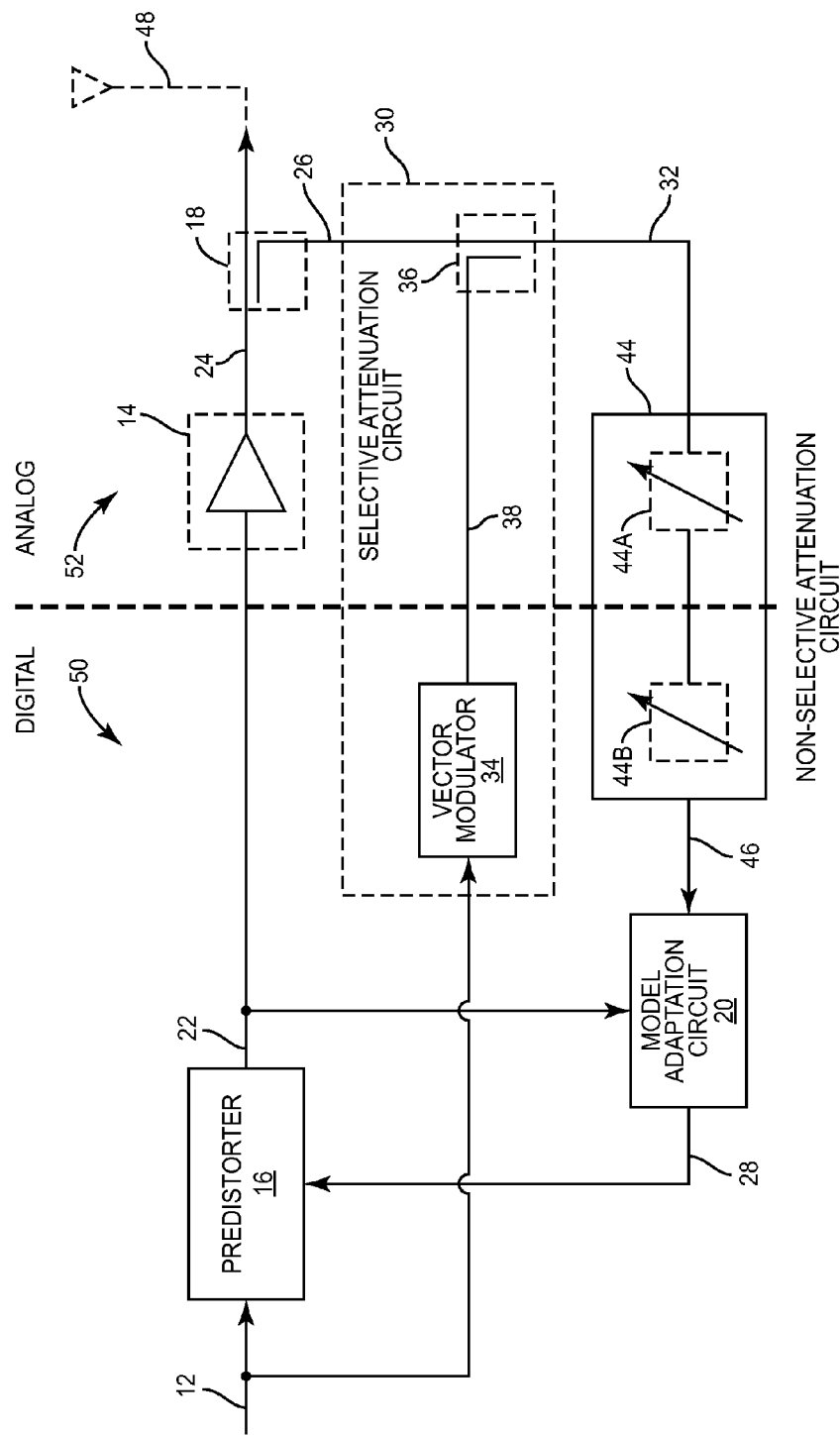
FIG. 5 is a block diagram that illustrates additional details of the circuit of FIG. 3 in a context where the circuit is included in the transmit chain of a transmitter, according to at least some embodiments.

Although embodiments herein do not require certain circuits to be implemented in one domain or another, at least some embodiments predistort the input signal 12 in the digital domain and selectively attenuate the input signal components 26A of the feedback signal 26 in the analog domain. FIG. 5 illustrates an example of such an embodiment in a context where the circuit 10 is comprised in the transmit chain of a transmitter.

As shown in FIG. 5, the input signal 12 is a communications signal in the digital domain 50 that is to be converted to the analog domain 52, upconverted to a radio frequency (RF), amplified in the analog domain 52 by an RF power amplifier 14, and transmitted by one or more antennas 48. To compensate for distortion introduced by the RF power amplifier 14, however, the predistorter 16 predistorts the input signal 12 in the digital domain 50 according to a predistortion model. To dynamically adapt the parameters of this model, the model adaptation circuit 20 observes distortion components 26B within a signal 46 that has been selectively attenuated by the selective attenuation circuit 30 and non-selectively attenuated by the non-selective attenuation circuit 44.

In this regard, an RF coupler 18 generates a feedback signal 26 from the output of the RF power amplifier 14. Meanwhile, a vector modulator 34 within the selective attenuation circuit 30 generates a digital version 38 of the input signal 12 to have a phase and magnitude such that, when it is converted into the analog domain 52, upconverted to RF, and then injected into the feedback path by an RF coupler 36, the input signal components 26A in the feedback signal 26 are selectively attenuated by a predefined amount. As attenuating the input signal components 26A may also be referred to as cancelling carrier components in the feedback signal 26, such may be understood as RF coupling a carrier cancellation path to the feedback path in the analog domain 52. Regardless, the modified version 32 of the feedback signal 26 generated from this selective attenuation is then non-selectively attenuated by analog and digital attenuators 44A, 44B. The analog attenuator 44A provides coarse non-selective attenuation (e.g., in 1 dB steps), while the digital attenuator 44B provides fine non-selective attenuation (e.g., in 1/16 dB steps). This selective attenuation followed by non-selective attenuation proves to advantageously extend the dynamic range of the circuit 10, e.g., by an additional 10 to 20 dB depending on the accuracy with which it is implemented.

While embodiments above have been illustrated using a two-tone signal, those skilled in the art will appreciate that no particular communication interface standard is necessary for practicing the present invention. Indeed, the input signal 12 may have any number of tones and, when used in the context of wireless communications, may be configured according to any type of communications standard, e.g., standards based on Wideband CDMA, High-Speed Packet Access (HSPA), Long Term Evolution (LTE), CDMA 2000, WiMax, or the like.

Those skilled in the art will further appreciate that the various "circuits" described may refer to a combination of analog and digital circuits, including one or more processors configured with software stored in memory and/or firmware stored in memory that, when executed by one or more processors, perform as described above. One or more of these processors, as well as the other digital hardware, may be included in a single application-specific integrated circuit (ASIC), or several processors and various digital hardware may be distributed among several separate components, whether individually packaged or assembled into a system-on-a-chip (SoC).

Figure 6:
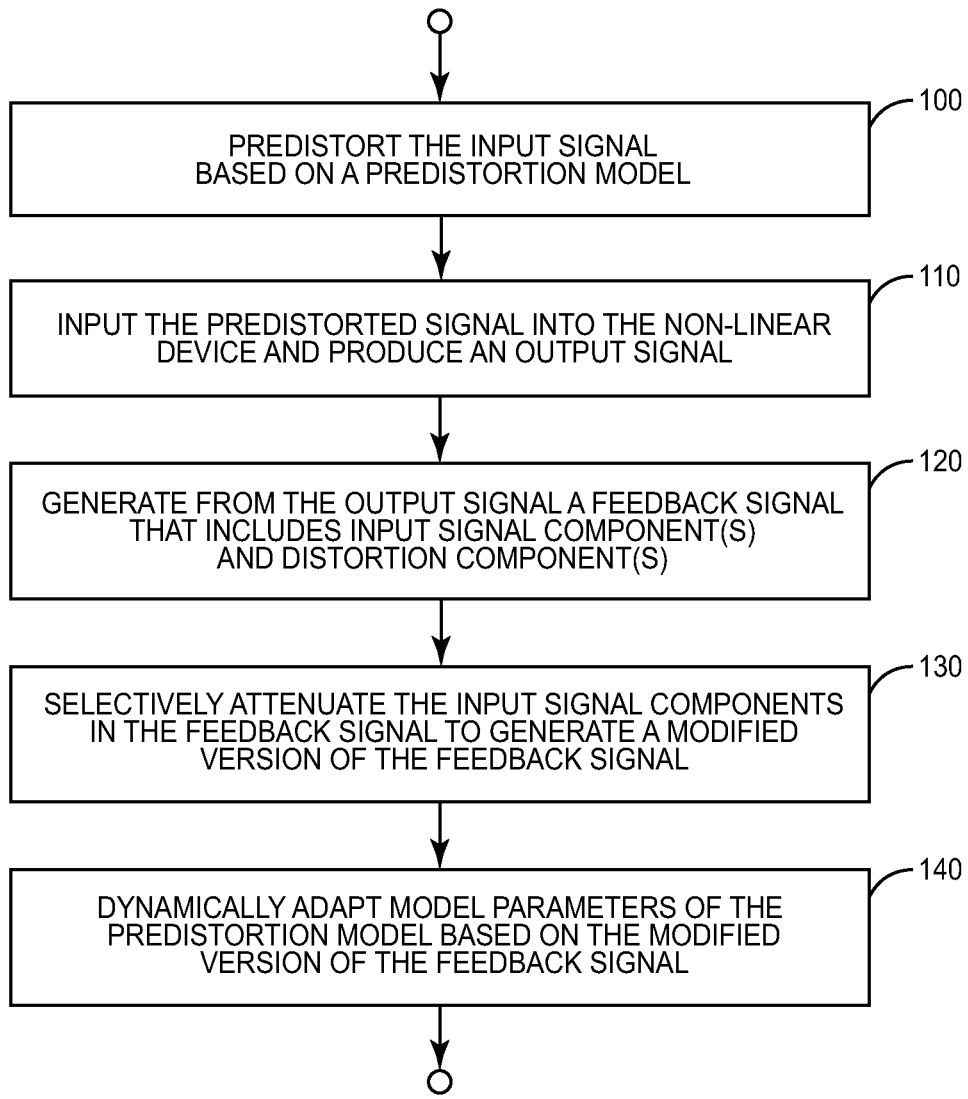
FIG. 6 is a logic flow diagram of processing performed by the circuit of FIG. 1 for compensating an input signal for distortion introduced to that signal by a non-linear device, according to one or more embodiments.

In view of the above modifications and variations, those skilled in the art will readily appreciate that the circuit 10 described above generally performs the processing illustrated in FIG. 6 for compensating an input signal 12 for distortion introduced to that signal 12 by a non-linear device 14. As shown in FIG. 6, such processing includes predistorting the input signal 12 based on a predistortion model to compensate for distortion introduced by the non-linear device 14 (Block 100). Processing further includes inputting the predistorted input signal 22 into the non-linear device 14 and producing an output signal 24 as a function of the predistorted input signal 22 (Block 110). Processing also entails generating from the output signal 24 a feedback signal 26 that includes one or more input signal components 26A and one or more distortion components 26B (Block 120). Notably, processing additionally comprises selectively attenuating the input signal components 26A in the feedback signal 26 to generate a modified version 32 of the feedback signal 26 with a reduced magnitude difference between the input signal components 26A and the distortion components 26B (Block 130). Finally, processing includes dynamically adapting model parameters of the predistortion model based on the modified version 32 of the feedback signal 26 (Block 140).

Thus, those skilled in the art will recognize that the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

What is claimed is:

1. A method of compensating an input signal for distortion introduced to that signal by a non-linear device, the method comprising:

predistorting the input signal based on a predistortion model to compensate for distortion introduced by the non-linear device;

inputting the predistorted input signal into the non-linear device and producing an output signal as a function of the predistorted input signal;

generating from the output signal a feedback signal that includes one or more input signal components and one or more distortion components;

selectively attenuating the input signal components in the feedback signal to generate a modified version of the feedback signal with a reduced magnitude difference between the input signal components and the distortion components; and dynamically adapting model parameters of the predistortion model based on the modified version of the feedback signal.

2. The method of claim 1, wherein selectively attenuating the input signal components in the feedback signal comprises removing a version of the input signal from the feedback signal.

3. The method of claim 2, wherein selectively attenuating the input signal components in the feedback signal further comprises generating the version of the input signal to have a phase and magnitude such that its removal from the feedback signal selectively attenuates the input signal components by a predefined amount.

4. The method of claim 3, wherein said generating comprises iteratively evaluating the amount by which the input signal components are selectively attenuated and manipulating at least one of the phase and magnitude of the version of the input signal as needed for said evaluation to indicate the input signal components are selectively attenuated by the predefined amount.

5. The method of claim 4, further comprising pausing said dynamic adaptation of said model parameters for a predefined interval of time and wherein said iterative evaluation and manipulation are performed during that interval of time.

6. The method of claim 2, wherein said removing comprises injecting the version of the input signal into a feedback path associated with the feedback signal.

7. The method of claim 1, wherein said predistorting comprises predistorting the input signal in the digital domain, and wherein said selective attenuating comprises selectively attenuating the input signal components in the analog domain.

8. The method of claim 1, further comprising non-selectively attenuating the modified version of the feedback signal as a whole, as needed to establish unity gain whereby the magnitude of the input signal components in the modified version of the feedback signal matches the magnitude of the input signal.

9. The method of claim 8, further comprising, responsive to changes in the amount by which the input signal components in the feedback signal are selectively attenuated, dynamically adjusting the amount by which the modified version of the feedback signal is non-selectively attenuated as a whole, as needed to re-establish unity gain.

10. The method of claim 1, wherein said non-linear device comprises a power amplifier.

11. A circuit comprising:
a non-linear device configured to produce an output signal as a function of an input signal;
a predistorter configured to predistort the input signal to the non-linear device based on a predistortion model to compensate for distortion introduced by the non-linear device;
a feedback generation circuit configured to generate from the output signal a feedback signal that includes one or more input signal components and one or more distortion components;
a selective attenuation circuit configured to selectively attenuate the input signal components in the feedback signal to generate a modified version of the feedback signal with a reduced magnitude difference between the input signal components and the distortion components; and
a model adaptation circuit configured to dynamically adapt model parameters of the predistortion model based on the modified version of the feedback signal.

12. The circuit of claim 11, wherein the selective attenuation circuit is configured to selectively attenuate the input signal components in the feedback signal by removing a version of the input signal from the feedback signal.

13. The circuit of claim 12, wherein the selective attenuation circuit is further configured to generate the version of the input signal to have a phase and magnitude such that its removal from the feedback signal selectively attenuates the input signal components by a predefined amount.

14. The circuit of claim 13, wherein the selective attenuation circuit includes a vector modulator configured to generate the version of the input signal.

15. The circuit of claim 13, further comprising an evaluation circuit configured to iteratively evaluate the amount by which the input signal components are selectively attenuated, and wherein the selective attenuation circuit is configured to iteratively manipulate at least one of the phase and magnitude of the version of the input signal as needed for said evaluation circuit to indicate the input signal components are selectively attenuated by the predefined amount.

16. The circuit of claim 15, wherein the model adaptation circuit is configured to pause dynamic adaptation of said model parameters for a predefined interval of time and wherein said evaluation circuit and selective attenuation circuit are configured to perform said evaluation and manipulation during that interval of time.

17. The circuit of claim 12, wherein the selective attenuation circuit is configured to remove the version of the input signal from the feedback signal by injecting the version of the input signal into a feedback path associated with the feedback signal.

18. The circuit of claim 17, wherein the selective attenuation circuit includes a coupler configured to inject the version of the input signal into said feedback path.

19. The circuit of claim 11, wherein said predistorter comprises a digital predistorter configured to predistort the input signal in the digital domain, and wherein the selective attenuation circuit is configured to selectively attenuate the input signal components in the analog domain.

20. The circuit of claim 11, further comprising a non-selective attenuation circuit configured to non-selectively attenuate the modified version of the feedback signal as a whole, as needed to establish unity gain whereby the magnitude of the input signal components in the modified version of the feedback signal matches the magnitude of the input signal.

21. The circuit of claim 20, wherein the non-selective attenuation circuit is configured, responsive to changes in the amount by which the input signal components in the feedback signal are selectively attenuated, dynamically adjust the amount by which the modified version of the feedback signal is non-selectively attenuated as a whole, as needed to re-establish unity gain.

22. The circuit of claim 11, wherein said non-linear device comprises a power amplifier.

* * * * *